United States Patent
Baik

(10) Patent No.: US 9,113,558 B2
(45) Date of Patent: Aug. 18, 2015

(54) LED MOUNT BAR CAPABLE OF FREELY FORMING CURVED SURFACES THEREON

(76) Inventor: Seong Gon Baik, Goyang-si (KR)

(*) Notice: Subject to any disclaimer, the term of this patent is extended or adjusted under 35 U.S.C. 154(b) by 0 days.

(21) Appl. No.: 13/505,738

(22) PCT Filed: Sep. 8, 2010

(86) PCT No.: PCT/KR2010/006098
§ 371 (c)(1),
(2), (4) Date: May 2, 2012

(87) PCT Pub. No.: WO2011/052885
PCT Pub. Date: May 5, 2011

(65) Prior Publication Data
US 2012/0217520 A1    Aug. 30, 2012

(30) Foreign Application Priority Data
Nov. 2, 2009   (KR) .................... 20-2009-0014232 U

(51) Int. Cl.
| H01L 29/18 | (2006.01) |
| H05K 1/02 | (2006.01) |
| F21S 4/00 | (2006.01) |
| F21Y 103/00 | (2006.01) |
| H01L 25/075 | (2006.01) |
| F21Y 101/02 | (2006.01) |

(52) U.S. Cl.
CPC .............. *H05K 1/0278* (2013.01); *F21S 4/003* (2013.01); *F21Y 2101/02* (2013.01); *F21Y 2103/003* (2013.01); *H01L 25/0753* (2013.01); *H05K 2201/09063* (2013.01); *H05K 2201/09263* (2013.01); *H05K 2201/10106* (2013.01)

(58) Field of Classification Search
CPC ......... F21S 4/007; F21S 48/215; F21S 4/003; F21Y 2101/02; F21Y 2103/003; G09F 13/22; G09F 2013/1895; G09F 9/33; H05K 1/0393; H05K 1/148; H05K 2201/10106; H05K 1/0278; H01L 25/13; H01L 2224/48091; H01L 2924/00; H01L 2924/00014; H01L 25/0753; H01L 2224/48247; H01L 2924/12041; H01L 21/2007; H01L 2224/16; H01L 24/16; H01L 2224/73265; H01L 24/32; H01L 24/45; H01L 27/153
USPC ............................................ 257/88, E33.055
See application file for complete search history.

(56) References Cited

U.S. PATENT DOCUMENTS

| 4,439,818 | A | * | 3/1984 | Scheib .................... 362/249.06 |
| 5,084,804 | A | | 1/1992 | Schairer |
| 5,519,596 | A | * | 5/1996 | Woolverton ............ 362/249.01 |
| 2001/0036082 | A1 | | 11/2001 | Kanesaka |
| 2003/0071581 | A1 | * | 4/2003 | Panagotacos et al. .... 315/185 R |

(Continued)

FOREIGN PATENT DOCUMENTS

| JP | 61-182590 U | 11/1986 |
| JP | 2006-507543 | 3/2006 |

(Continued)

OTHER PUBLICATIONS

International Search Report for PCT/KR2010/006098 mailed Mar. 28, 2011.

*Primary Examiner* — Duy T Nguyen
(74) *Attorney, Agent, or Firm* — AKC Patents LLC; Aliki K. Collins

(57) ABSTRACT

A bar on which a plurality of LEDs are mounted. The bar has a first side surface having a plurality of grooves and a second side surface having a plurality of grooves, wherein the plurality of first grooves formed at the first side surface and the plurality of second grooves formed at the second side surface intersect each other such that the bar can be easily bent in a widthwise direction.

4 Claims, 3 Drawing Sheets

(56) References Cited

U.S. PATENT DOCUMENTS

| | | | |
|---|---|---|---|
| 2005/0239342 A1* | 10/2005 | Moriyama et al. | 439/699.2 |
| 2007/0263385 A1* | 11/2007 | Fan | 362/252 |
| 2009/0242910 A1* | 10/2009 | Murofushi et al. | 257/88 |

FOREIGN PATENT DOCUMENTS

| | | |
|---|---|---|
| JP | 2008-72143 | 3/2008 |
| JP | 2008-300344 | 12/2008 |
| JP | 2009-021481 | 1/2009 |
| JP | 2009-021532 | 1/2009 |
| JP | 2009-042260 | 2/2009 |
| KR | 10-2003-0041777 | 5/2003 |
| KR | 10-2005-0085090 | 8/2005 |
| KR | 10-2008-0002264 | 1/2008 |
| KR | 10-2010-0007822 | 1/2010 |

* cited by examiner (a)

(b)

US 9,113,558 B2

LED MOUNT BAR CAPABLE OF FREELY FORMING CURVED SURFACES THEREON

RELATED APPLICATIONS

This application is a 371 application of International Application No. PCT/KR2010/006098, filed Sep.8, 2010, which in turn claims priority from Korean Patent Application No. 20-2009-0014232, filed Nov.2, 2009, each of which is which is incorporated herein by reference in its entirety.

FIELD OF THE INVENTION

The present invention relates to a bar on which a plurality of LEDs are mounted, more particularly, a LED mount bar capable of freely forming curved surfaces thereon which can be easily bent in a required form.

BACKGROUND OF THE INVENTION

As electronic components are reduced in size and designs of electronic products are gradually diversified, the forms of modules mounted with the electronic components are diversified. For example, in the field of advertisement or illumination, for achieving illumination of desired letters or patterns, there are more and more needs to arrange a plurality of LEDs on a plane module(it can be hardly bent) in the same form as relevant letters or relevant patterns.

By the way, the bar used in the field of illumination or advertisement can be relatively well bent in up-and-down direction of the bar, as illustrated in FIG. 6 (refer to FIG. 6 (a)), however, can be hardly bent in a width direction of the bar (refer to FIG. 6 (b)), therefore, in order to arrange the plurality of LEDs in a desired form, a plurality of bars mounted with LEDs have to be connected one by one or the bars have to be specially fabricated so as to conform to required form, thus there is disadvantage that work is troublesome and much cost and time are consumed.

SUMMARY OF THE INVENTION

The present invention has been devised for solving the above-mentioned problems, and its object is to provide a LED mount bar capable of freely forming curved surfaces thereon wherein the bar mounted with a plurality of LEDs can be freely bent according to the requirement of users and thus the plurality of LEDs can be arranged in a desired form.

According to a first embodiment of the present invention for achieving the object, there is provided a LED mount bar capable of freely forming curved surfaces thereon and mounted with a plurality of LEDs in a long row or long plural rows, wherein the bar is characterized in that a plurality of grooves are formed at first and second side surfaces of the bar such that the bar can be easily bent in a width direction, and a plurality of first grooves formed at the side surface and a plurality of second grooves formed at the second first side surface are staggered.

According to a second embodiment of the present invention for achieving the object, there is provided a LED mount bar capable of freely forming curved surfaces thereon and mounted with a plurality of LEDs in a long row or long plural rows, wherein the bar is characterized in that it comprises a plurality of mounts for mounting at least one LEDs and connection portions of curved form for connecting the plurality of mounts.

Since the bar according to the present invention can be bent in a form desired by users, the users can arrange the LEDs mounted on the bar in the desired form (for example, a circular form).

Therefore, according to the present invention, a plurality of LEDs can be arranged in the form required by the users, without connecting one by one a plurality of bars mounted with LEDs or specially fabricating the bars.

In addition, since the present invention enables the bar mounted with a plurality of LEDs to be freely bent, the bar mounted with a plurality of LEDs can be very conveniently installed so as to conform to the shape of a device and also time and cost required for installing of the bar can be drastically decreased.

DETAILED DESCRIPTION OF EXEMPLARY EMBODIMENTS

In the following, the present invention will be described in detail with reference to the attached drawings.

Figure 1:
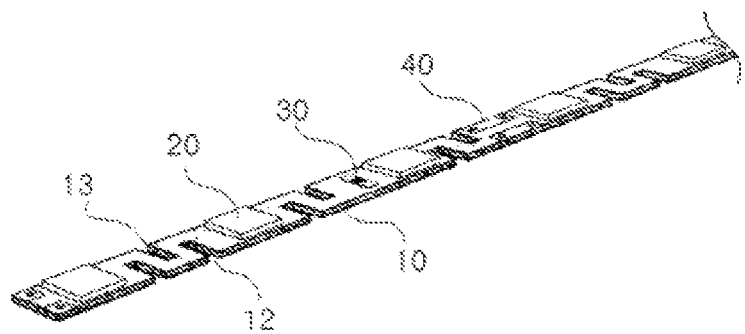
FIG. 1 is a perspective view of a LED mount bar according to a first embodiment of the present invention.
Figure 2:
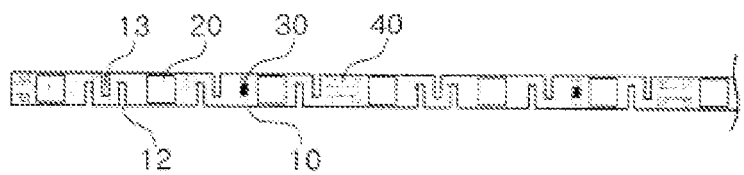
FIG. 2 is a top view of the LED mount bar illustrated in FIG. 1.
Figure 3:
FIG. 3 is a side view of the LED mount bar illustrated in FIG. 1.
Figure 4:
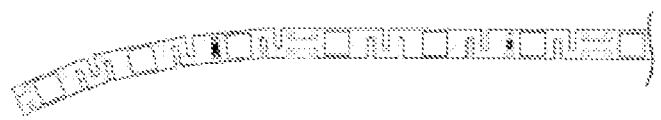
FIG. 4 is a top view illustrating an example of using the LED mount bar illustrated in FIG. 1.
Figure 5:
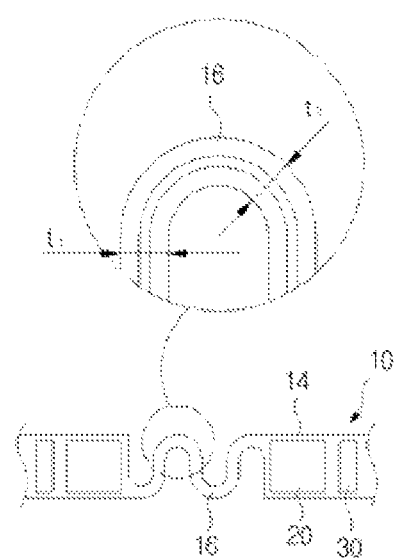
FIG. 5 is a top view of a LED mount bar according to a second embodiment of the present invention.
Figure 6:
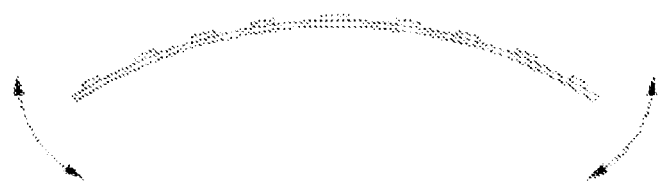
FIG. 6 illustrates an example of using a conventional LED mount bar.
Figure 6:
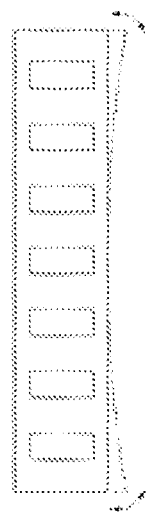

FIG. 1 is a perspective view of a LED mount bar according to a first embodiment of the present invention, FIG. 2 is a top view of the LED mount bar illustrated in FIG. 1, FIG. 3 is a side view of the LED mount bar illustrated in FIG. 1, FIG. 4 is a top view illustrating an example of using the LED mount bar illustrated in FIG. 1, and FIG. 5 is a top view of a LED mount bar according to a second embodiment of the present invention.

(A First Embodiment)

A LED mount bar (10) according to the present invention comprises LEDs (20), resistors (30) and power terminals (40).

The bar (10) is thin and elongate, and is made of material having a predetermined elasticity and strength (for reference, the bar can be made of the same material as that of the conventional PCB). Arranged on the bar (10) are a plurality of the LEDs (20), a plurality of the resistors (30), a plurality of the power terminals (40) and other electronic components. The bar (10) formed as described above may be cut to a unit of fixed length, if required. Meanwhile, a plurality of grooves (12, 13) are formed at both side surfaces of the bar (10). Preferably, the plurality of grooves (12, 13) are formed at side surfaces of the portions of the bar (10) where any electronic components are not mounted. Here, grooves (12) formed at a first side surface of the bar (10) (right side surface of the bar in FIG. 1) and grooves (13) formed at a second side surface of the bar (left side surface of the bar in FIG. 1) are staggered, thus the bar (10) is partially in the form of zigzag.

The plurality of LEDs (20) are arranged along the longitudinal direction of the bar (10) with a fixed interval, and the resistors (30) are arranged on the bar (10) depending on the number of the LEDs (20) arranged and capacitance of the LEDs (20). Then, the power terminals (40) are arranged in a unit of minimum length to which the bar (10) can be cut (for example, one power terminal per four LEDs (20)).

Since the bar (10) of the present invention constructed as above has a structure where the portion of the bar (10) mounted with any LEDs (20) and the portion of the bar (10) mounted with another LEDs (20) adjacent to the LEDs (20) are connected in the zigzag form for easy bending, the plurality of LEDs (20) are easy to be arranged in a curved form as illustrated in FIG. 4 or in a circular form.

(A Second Embodiment)

The bar (10) according to the second embodiment consists of a plurality of mounts (14) for mounting electronic components or LEDs (20) and connection portions (16) for connecting the mounts (14).

The mounts (14) are arranged along the longitudinal direction of the bar (10) with a fixed interval, and are mounted with various electronic components(the LEDs (20), resistors (30) and power terminals (40)) depending on the purpose of using of the bar (10).

The connection portions (16) have a zigzag form where linear portions and curved portions are repeatedly connected and connect two mounts (14) with each other. Preferably, as illustrated in FIG. 5, for the connection portions (16), width (t1) of the linear portion and width (t2) of the curved portion are identical to each other. If the width of the linear portion is identical to that of the curved portion, as described above, strain in width direction of the linear portion is identical to that of the curved portion, therefore, the connection portion is easy to be bent without deviation in the width direction, compared to the first embodiment having no curved portion.

Thus, this embodiment is very advantageous in the case that the bar (10) should be bent to a great degree to be mounted.

What is claimed:

1. A LED mount bar to mount thereon a plurality of LEDs in a row, the mount bar extending along a first direction and comprising:

a plurality of LED mounting portions, each mounting portion arranged in the row along the first direction to mount a LED thereon; and a plurality of connection portions arranged in the row along the first direction and being co-planar with the LED mounting portions and wherein each connection portion is arranged between two neighboring LED mounting portions and is configured to connect the two neighboring LED mounting portions, and wherein each connection portion comprises a plurality of consecutive segments, each segment comprising a linear portion and a curved portion;

wherein the LED mount bar has an elongated shape extending along the first direction and wherein the LED mounting portions and the connection portions are monolithic and integral to each other and form together the elongated LED mount bar;

wherein each connection portion includes first and second sides opposite to each other, wherein the first and second sides have first and second grooves respectively, wherein the first and second grooves are formed at different positions in a length of the connection portion;

wherein for each connection portion, width of the linear portions and width of the curved portions are identical to each other;

wherein each of the connection portions comprises a zigzag form, where the linear portions and curved portion are repeatedly connected; and wherein each connection portion is configured to bend in a width direction, wherein said width direction is co-planar with and perpendicular to the first direction.

2. The LED mount bar of claim 1, wherein the first side further has a third groove formed at a different position from the positions of the first and second grooves in the length of the connection portion.

3. The LED mount bar of claim 1, wherein each of the first and second grooves has the linear portion.

4. The LED mount bar of claim 1, wherein each of the first and second grooves has the curved portion.

\* \* \* \* \*